(12) United States Patent
Yeum

(10) Patent No.: US 7,062,521 B2
(45) Date of Patent: Jun. 13, 2006

(54) DIGITAL BASE BOOSTER USING ARITHMETIC PROCESSOR

(75) Inventor: Wang-seup Yeum, Yongin (KR)

(73) Assignee: Samsung Electronics Co., Ltd. (KR)

( * ) Notice: Subject to any disclaimer, the term of this patent is extended or adjusted under 35 U.S.C. 154(b) by 825 days.

(21) Appl. No.: 10/044,187

(22) Filed: Jan. 10, 2002

(65) Prior Publication Data

US 2002/0126858 A1    Sep. 12, 2002

(30) Foreign Application Priority Data

Jan. 19, 2001    (KR)    ................................. 2001-3166

(51) Int. Cl.
*G06F 17/10* (2006.01)
(52) U.S. Cl. .................................................... 708/320
(58) Field of Classification Search ................ 708/300, 708/303, 319, 320
See application file for complete search history.

(56) References Cited

U.S. PATENT DOCUMENTS

| | | | | |
|---|---|---|---|---|
| 5,432,723 A | * | 7/1995 | Chen et al. .................. | 708/300 |
| 5,524,022 A | * | 6/1996 | Kihara et al. ................ | 375/229 |
| 5,687,104 A | * | 11/1997 | Lane et al. .................. | 708/300 |
| 5,737,254 A | * | 4/1998 | Lane et al. .................. | 708/320 |
| 6,112,218 A | * | 8/2000 | Gandhi et al. .............. | 708/320 |

* cited by examiner

*Primary Examiner*—Chuong D. Ngo
(74) *Attorney, Agent, or Firm*—Mills & Onello LLP

(57) ABSTRACT

A digital base booster (DBB) for reducing hardware by using an arithmetic processor is provided. Instead of using a conventional IIR filter having a cascade structure including a plurality of partial building blocks, the digital base booster using an arithmetic processor includes first internal data, an inputting portion, a data assigner, an arithmetic portion, and an output data storing device. The first internal data is the output data of the arithmetic portion. The inputting portion includes a plurality of multi-bit registers, thereby storing input data and the first internal data and outputting the stored data in a predetermined signal. The data assigner selects one output data from a plurality of output data of the inputting portion. The arithmetic portion performs an arithmetic operation on the output data of the data assigner and data stored in the arithmetic portion, compensates for and stores a round-off error of the data output by the operation, and outputs the first internal data. The output data storing device stores and outputs data processed in the arithmetic portion.

9 Claims, 2 Drawing Sheets

DIGITAL BASE BOOSTER USING ARITHMETIC PROCESSOR

BACKGROUND OF THE INVENTION

1. Field of the Invention

The present invention relates to digital signal processing, and more particularly, to a digital base booster (DBB) in a digital audio system.

2. Description of the Related Art

In general, a digital base booster (DBB) used in emphasizing a particular band of the frequency of sound reproduced in a digital audio system is implemented by a finite impulse response (FIR) filter or an infinite impulse response (IIR) filter.

FIG. 1 illustrates the structure of an embodiment of a conventional digital base booster (DBB) implemented by an infinite impulse response (IIR) filter. Referring to FIG. 1, the conventional DBB includes three partial building blocks, including a base band filter 110, a middle band filter 130, and a treble band filter 150, as well as a first adder 170.

The base band filter 110 includes a second adder 111, a third adder 112, a first delay device 113, and first through fourth shifters 114–117.

The second adder 111 adds input data x(n) to data, in which output data qb[n−1] of the first delay device 113 is multiplied by an arbitrary coefficient −b11 stored in the first shifter 114. The third adder 112 adds data, in which the output data qb[n−1] of the first delay device 113 is multiplied by an arbitrary coefficient a11 stored in the second shifter 115, to data, in which output data qb[n] of the second adder 111 is multiplied by an arbitrary coefficient a01 stored in the third shifter 116.

The first delay device 113 delays the output of the second adder 111, and the fourth shifter 117 stores a coefficient Gb multiplied by the output of the third adder 112.

The middle band filter 130 includes a fourth adder 131, a fifth adder 132, a second delay device 133, a third delay device 134, and fifth through tenth shifters 135–140.

The fourth adder 131 adds input data x(n) and data, in which output data qm[n−1] of the second delay device 133 is multiplied by an arbitrary coefficient −b12 stored in the fifth shifter 135, to data, in which output data qm[n−2] of the third delay device 134 is multiplied by an arbitrary coefficient −b22 stored in the sixth shifter 136. The fifth adder 132 adds data, in which the output data qm[n−1] of the second delay device 133 is multiplied by an arbitrary coefficient a12 stored in the seventh shifter 137, and data, in which the output data qm[n−2] of the third delay device 134 is multiplied by an arbitrary coefficient a22 stored in the eighth shifter 138, to data, in which output data of qm[n] of the fourth adder 131 is multiplied by an arbitrary coefficient a02 stored in the ninth shifter 139. The second delay device 133 delays the output data qm[n] of the fourth adder 131, and the third delay device 134 delays the output data qm[n−1] of the second delay device 133. The tenth shifter 140 stores a coefficient Gm multiplied by the output of the fifth adder 132.

The treble band filter 150 includes a sixth adder 151, a seventh adder 152, a fourth delay device 153, and eleventh through fourteenth shifters 154–157.

The sixth adder 151 adds input data x(n) to data, in which output data qt[n−1] of the fourth delay device 153 is multiplied by an arbitrary coefficient −b13 stored in the eleventh shifter 154. The seventh adder 152 adds data, in which the output data qt[n−1] of the fourth delay device 153 is multiplied by an arbitrary coefficient a13 stored in the twelfth shifter 155, to data, in which output data qt[n] of the sixth adder 151 is multiplied by an arbitrary coefficient a03 stored in the thirteenth shifter 156. The fourth delay device 153 delays the output data qt[n] of the sixth adder 151, and the fourteenth shifter 157 stores a coefficient Gt multiplied by the output of the seventh adder 152.

The first adder 170 adds output data of the base band filter 110, the middle band filter 130, and the treble band filter 150.

A transfer function H(z) of the IIR filter of the DBB shown in FIG. 1 is as follows:

$$H(z) = Gb * \frac{a01 + a11Z^{-1}}{1 + b11Z^{-1}} + Gm * \frac{a02 + a12Z^{-1} + a22Z^{-2}}{1 + b12Z^{-1} + b22Z^{-2}} + Gt * \frac{a03 + a13Z^{-1}}{1 + b13Z^{-1}} \qquad \text{[Equation 1]}$$

In Equation 1, the IIR filter consists of cascade structures of a direct form.

In general, if a high-order IIR filter consists of a direct form, an arithmetic round-off error caused by an arithmetic operation in finite bits, and a coefficient quantization error occur. In particular, overflow occurs in a feedback adder, and in order to solve the problem, an IIR filter having a cascade structure consists of partial building blocks, as shown in FIG. 1.

However, in the case of the DBB system consisting of the three partial building blocks, as shown in FIG. 1, a plurality of multi-bit shifters are required to provide feedback coefficients −b11, −b12, −b22, and −b13, forward coefficients a01, a11, a02, a12, a22, a03, and a13, and gain coefficients Gb, Gm, and Gt, and for arithmetic operation of the coefficients, a multi-bit multiplier, a multi-bit feedback adder, and a forward adder are used recursively. As a result, hardware should be increased in proportion to the number of cascade structures and the size of arithmetic bits.

SUMMARY OF THE INVENTION

To solve the above problems, it is an object of the present invention to provide a digital base booster realized with a reduced amount of hardware by using an arithmetic processor.

Accordingly, to achieve the object, according to an embodiment of the present invention, there is provided a digital base booster (DBB). The DBB includes first internal data, an inputting portion, a data assigner, an arithmetic portion, and an output data storing device. The first internal data are output data of the arithmetic portion. The inputting portion includes a plurality of multi-bit registers to respond to input data and the first internal data. The data assigner selects one output data set from a plurality of output data sets of the inputting portion. The arithmetic portion performs an arithmetic operation on the output data of the data assigner and data stored in the arithmetic portion, compensates for a round-off error of the data output by the arithmetic operation, stores the compensated result and outputs the first internal data. The output data storing device stores data processed in the arithmetic portion.

In one embodiment, one multi-bit register of the plurality of multi-bit registers stores the input data and outputs the stored input data in response to a related control signal, and the other multi-bit registers store the first internal data and output the stored first internal data in response to a related control signal.

In one embodiment, the data assigner is a multiplexer.

In one embodiment, the arithmetic portion includes second internal data, a first data register, a second data register, an arithmetic data portion, a first multiplexer, an arithmetic processor, an error compensator, and a third data register. The second internal data are output data of the arithmetic processor, and the first data register stores the second internal data. The second data register stores and outputs the output data of the data assigner. The first multiplexer selects the output data of the first data register and the output data of the second data register. The arithmetic data portion selects the output data of the data assigner and the second internal data to store and output intermediate data during an arithmetic operation. The arithmetic processor arithmetically processes the output data of the first multiplexer and data stored in the arithmetic processor and adds the arithmetically processed data to the output data of the arithmetic data portion to output the second internal data. The error compensator compensates for a round-off error for the second internal data which is the output data of the arithmetic processor. The third data register stores the output data of the error compensator.

In one embodiment, the arithmetic data portion includes a second multiplexer for selecting the second internal data and the output data of the data assigner, a fourth data register for storing the output data of the second multiplexer, and a data path controller for controlling transmission of the output data of the fourth data register. In one embodiment, the arithmetic processor includes a barrel shifter for performing an arithmetic operation in response to the output data of the first multiplexer, a first adder for adding the output data of the barrel shifter, and a second adder for adding the output data of the first adder to the output data of the arithmetic data portion.

When there is one barrel shifter, the area of hardware can be fairly reduced, but an arithmetic operation should be repeatedly performed, and thus, it is difficult to allow the barrel shifter to be used in a system of which processing speed is important. In such a case, it is preferable to use a plurality of barrel shifters.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
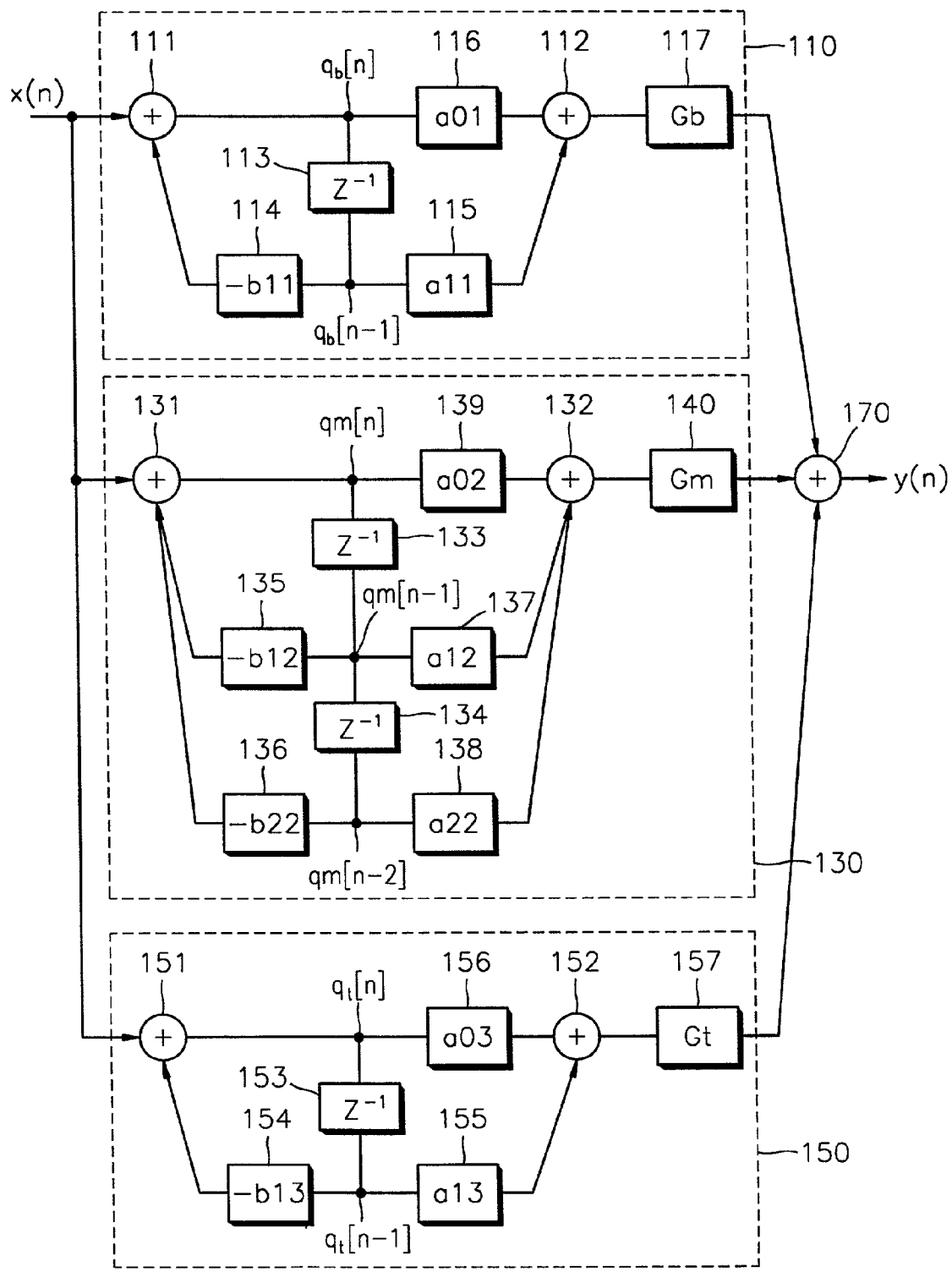
FIG. 1 illustrates the structure of a conventional digital base booster (DBB) implemented by an infinite impulse response (IIR) filter.
Figure 2:
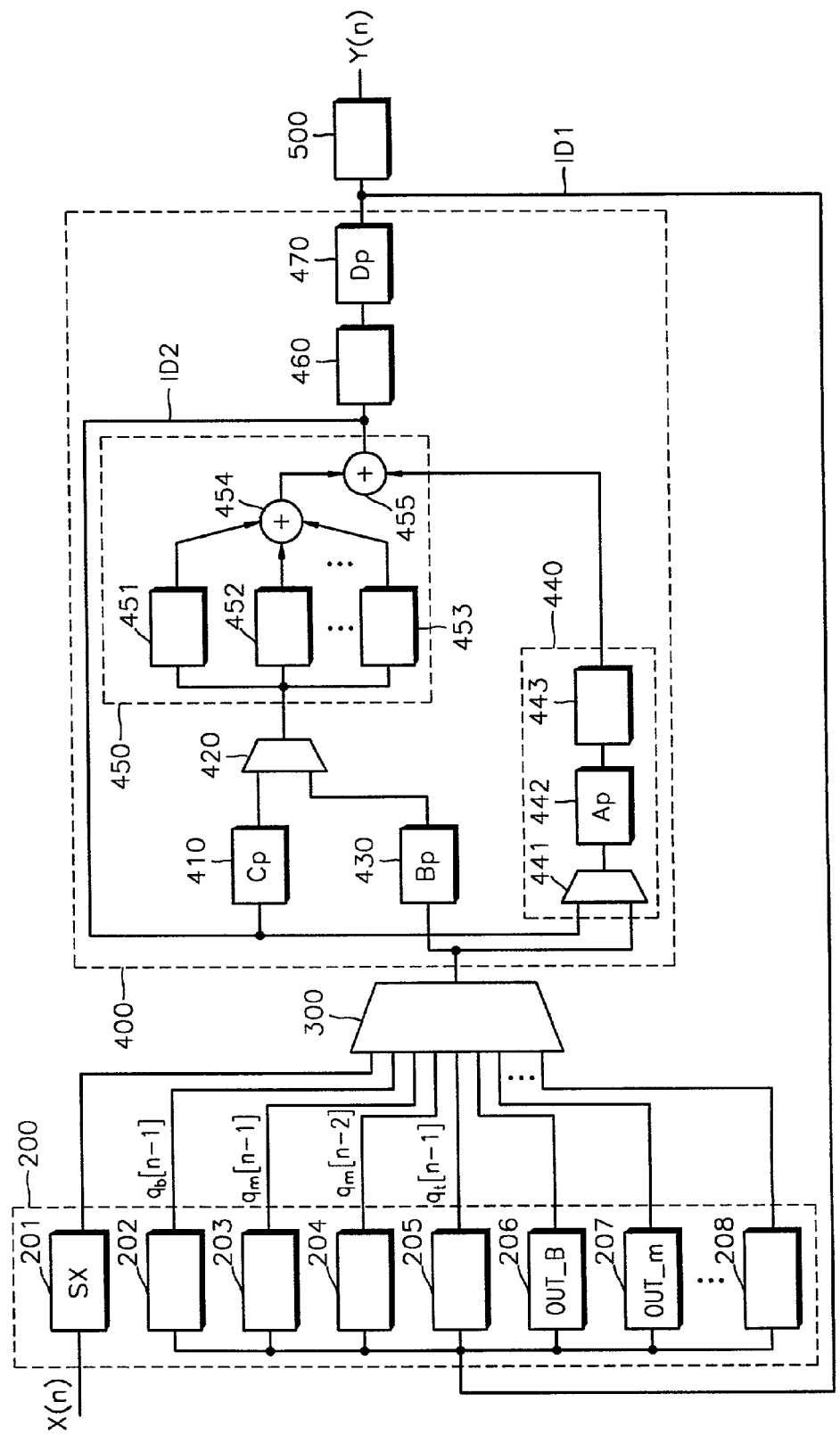
FIG. 2 illustrates the structure of a digital base booster (DBB) according to the present invention.

FIG. 2 illustrates the structure of one embodiment of a digital base booster (DBB) according to the present invention. Referring to FIG. 2, the digital base booster according to an embodiment of the present invention includes an inputting portion 200, a data assigner 300, an arithmetic portion 400, and an output data storing device 500.

The inputting portion 200 includes a plurality of multi-bit registers 201–207 for storing input data X(n) and first internal data ID1 output from the arithmetic portion 400 and outputting the stored data in response to a predetermined control signal. The multi-bit register 201 stores the input data X(n) and outputs the stored data in response to a predetermined control signal (not shown), and the other multi-bit registers 202–207 store the first internal data ID1 and output the stored data in response to a predetermined control signal (not shown). The data assigner 300 selects one output data from a plurality of output data of the inputting portion 200.

The arithmetic portion 400 includes a first data register 410, a first multiplexer 420, a second data register 430, an arithmetic data portion 440, an arithmetic processor 450, an error compensator 460, and a third data register 470.

The arithmetic portion 400 performs an arithmetic operation on the data output from the data assigner 300 and data (not shown) stored in the arithmetic processor 450, compensates for a round-off error of data output by the operation, stores the compensated result and outputs the first internal data ID1.

The first data register 410 stores second internal data ID2 output from the arithmetic processor 450. The second data register 430 stores the first internal data ID1 output from the data assigner 300 and provides the stored delayed data to the arithmetic processor 450. The first multiplexer 420 selects the output data of the first data register 410 and the output data of the second data register 430, thereby providing them to the arithmetic processor 450. The arithmetic data portion 440 includes a second multiplexer 441 for selecting the output data of the data assigner 300 and the second internal data ID2 a fourth data register 442 for storing output data of the second multiplexer 441, and a data path controller 443 for controlling transmission of the output data of the fourth data register 442, thereby storing the intermediate data during arithmetic operation of the arithmetic processor 450 and providing the stored data to the arithmetic processor 450.

The arithmetic processor 450 includes a plurality of barrel shifters 451–453 for performing an arithmetic operation on the data output from the first multiplexer 420 and internal data (not shown), a first adder 454 for adding the output data of the barrel shifters 451–453 and a second adder 455 for adding the output data of the first adder 454 to the output data of the arithmetic data portion 440.

The error compensator 460 compensates for a round-off error of the second internal data ID2 output form the arithmetic processor 450, and the third register 470 stores the output data of the error compensator 460.

The output data storing device 500 stores the processed result of the arithmetic portion 400.

The arithmetic procedure for implementing a conventional middle band filter using the digital base booster according to the present invention is described as below.

| | |
|---|---|
| Step 1 | Sx ← X(n) |
| Step 2 | Ap ← Sx |
| Step 3 | Bp ← qm[n − 2] |
| Step 4 | Ap ← Ap + (b22 * Bp),   Bp ← qm[n − 1] |
| Step 5 | Cp, Dp ← Ap + (b12 * Bp),   Bp ← qm[n − 2] |
| Step 6 | Ap ← 0 + (a22 * Bp),   Bp ← qm[n − 1] |
| Step 7 | Ap ← Ap + (a12 * Bp) |
| Step 8 | Ap, Cp ← Ap + (a02 * Cp) |
| Step 9 | Dp ← 0 + Bp, qm[n − 1] ← Dp |
| Step 10 | Dp ← Ap + (Gm * Cp), qm[n − 2] ← Dp |
| Step 11 | OUT_m ← Dp |

Here, arrows (←) mean that data on the right side of the arrows (←) are stored in registers on the left side of the arrows (←).

In step 1, the input data X(n) are stored in the register 201.

In step 2, the input data X(n) which are stored in the register 201, are passed through the data assigner 300 and the second multiplexer 441, and then stored in the fourth data register 442.

In step 3, middle band delayed data qm[n−2] stored in the multi-bit register 204 of the inputting portion 200 are passed through the data assigner 300, and then stored in the second data register 430.

In step 4, the middle band delayed data qm[n−2], which are stored in the second data register 430, are multiplied with a feedback path coefficient (not shown, b22), which is stored in the arithmetic processor 450, in the arithmetic processor 450. The multiplied data are added to the input data X(n) stored in the fourth data register 442, and then stored in the fourth data register 442, and simultaneously, middle band delayed data qm[n−1] output from the multi-bit register 203 of the inputting portion 200 are stored in the second data register 430.

In step 5, the middle band delayed data qm[n−1], which are stored in the second data register 430, are multiplied with a feedback path coefficient (not shown, b12), which is stored in the arithmetic processor 450, in the arithmetic processor 450. The multiplied data are added to data stored in the fourth data register 442, and then stored in the first data register 410 and the third register 470, and simultaneously, middle band delayed data qm[n−2] output from the multi-bit register 204 of the inputting portion 200 are stored in the second data register 430.

In step 6, the data stored in the fourth data register 442 are transmitted to the data path controller 443, thereby removing all data. After that, the middle band delayed data qm[n−2], which are stored in the second data register 430, are multiplied with a forward path coefficient (not shown, a22), which is stored in the arithmetic processor 450, in the arithmetic processor 450. The multiplied data are stored in the fourth data register 442, and simultaneously, the middle band delayed data qm[n−1] output from the multi-bit register 203 of the inputting portion 200, are stored in the second data register 430.

In step 7, the middle band delayed data qm[ n−1], which are stored in the second data register 430, are multiplied with a forward path coefficient (not shown, a12), which is stored in the arithmetic processor 450, in the arithmetic processor 450. The multiplied data are added to the data stored in the fourth data register 442, and then stored in the fourth data register 442.

In step 8, data, which are stored in the first data register 410, are multiplied with a forward path coefficient (not shown, a02), which is stored in the arithmetic processor 450, in the arithmetic processor 450. The multiplied data are added to the data stored in the fourth data register 442, and then stored in first data register 410 and the fourth data register 442.

In step 9, the data stored in the fourth data register 442 are transmitted to the data path controller 443, thereby removing all data. After that, the middle band delayed data qm[n−1], which are stored in the second data register 430, are multiplied with a bypass coefficient (not shown), which is stored in the arithmetic processor 450, in the arithmetic processor 450. The multiplied data are passed through the error compensator 460, and then stored in the third data register 470, and simultaneously, the first internal data ID1 output from the third data register 470, are stored in the multi-bit register 203 of the inputting portion 200.

In step 10, the data, which are stored in the first data register 410, are multiplied with a middle band gain coefficient (not shown, Gm), which is stored in the arithmetic processor 450, in the arithmetic processor 450. The multiplied data are added to the data stored in the fourth data register 442, and then stored in the third data register 470, and simultaneously, the first internal data ID1 output from the third data register 470, are stored in the multi-bit register 204 of the inputting portion 200.

In step 11, the data stored in the third data register 470 are stored in the multi-bit register 207 of the inputting portion 200.

In steps 4–6 and 9–10, two arithmetic operations are simultaneously performed. The reason the arithmetic operation can be simultaneously processed is because the paths of data to be processed are different. This is one of the advantages of the present invention. Preferably, the data registers used in the arithmetic operation include two separated stages, that is, of a master stage and a slave stage. This is the reason data input to the data registers does not collide with data output from the data registers. The above-described middle band filter is implemented as an example, and the base band filter and the treble band filter can be implemented using the arithmetic operation procedure, thereby obtaining data.

As described above, in the digital base booster according to the present invention, a conventional arithmetic processor is installed and repeatedly used, thereby performing functions of the conventional IIR filter with a small area, compared with the conventional IIR filter requiring a large area. The arithmetic operation time in the arithmetic processor is considerably shorter than the cycle of a system clock, and thus, the performance of the conventional IIR filter is shown, in view of the output to input characteristics.

As described above, the digital base booster using an arithmetic processor according to the present invention uses a barrel shifter instead of a multiplier and constitutes a feedback loop through an arithmetic processor sharing an adder when implementing the conventional IIR filter having a cascade structure including partial building blocks, thereby reducing the area taken up by hardware.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A digital base booster (DBB) comprising:
   an inputting portion including a plurality of multi-bit registers to respond to input data and first internal data;
   a single data assigner including a single output for selecting one set of output data from a plurality of sets of output data of the inputting portion;
   an arithmetic portion for performing an arithmetic operation on the output data of the data assigner and data stored in the arithmetic portion, compensating for a round-off error of the data output by the arithmetic operation, storing the compensated result and outputting the first internal data; and
   an output data storing device for storing data processed in the arithmetic portion.

2. The digital base booster as claimed in claim 1, wherein one multi-bit register of the plurality of multi-bit registers stores the input data and outputs the stored input data in response to a related control signal, and the other multi-bit registers store the first internal data and output the stored first internal data in response to a related control signal.

3. The digital base booster as claimed in claim 1, wherein the data assigner is a multiplexer.

4. The digital base booster as claimed in claim 1, wherein the arithmetic portion comprises:
   a first data register for storing second internal data;
   a second data register for storing and outputting the output data of the data assigner;
   a first multiplexer for selecting the output data of the first data register and the output data of the second data register;
   an arithmetic data portion for selecting the output data of the data assigner and the second internal data to store and output intermediate data during an arithmetic operation;
   an arithmetic processor for arithmetically processing the output data of the first multiplexer and data stored in the arithmetic processor, and adding the arithmetically-processed data to the output data of the arithmetic data portion to output the second internal data;
   an error compensator for compensating for a round-off error for the second internal data which is the output data of the arithmetic processor; and
   a third data register for storing the output data of the error compensator.

5. The digital base booster as claimed in claim 4, wherein the arithmetic data portion comprises:
   a second multiplexer for selecting the second internal data and the output data of the data assigner;
   a fourth data register for storing the output data of the second multiplexer; and
   a data path controller for controlling transmission of the output data of the fourth data register.

6. The digital base booster as claimed in claim 4, wherein the arithmetic processor comprises:
   a barrel shifter for performing an arithmetic operation in response to the output data of the first multiplexer;
   a first adder for adding the output data of the barrel shifter; and
   a second adder for adding the output data of the first adder to the output data of the arithmetic data portion.

7. A digital base booster (DBB) comprising:
   an inputting portion including a plurality of multi-bit registers to respond to input data and first internal data;
   a data assigner for selecting one set of output data from a plurality of sets of output data of the inputting portion;
   an arithmetic portion for performing an arithmetic operation on the output data of the data assigner and data stored in the arithmetic portion, compensating for a round-off error of the data output by the arithmetic operation, storing the compensated result and outputting the first internal data; and
   an output data storing device for storing data processed in the arithmetic portion;
   wherein the arithmetic portion comprises:
      a first data register for storing second internal data;
      a second data register for storing and outputting the output data of the data assigner;
      a first multiplexer for selecting the output data of the first data register and the output data of the second data register;
      an arithmetic data portion for selecting the output data of the data assigner and the second internal data to store and output intermediate data during an arithmetic operation;
      an arithmetic processor for arithmetically processing the output data of the first multiplexer and data stored in the arithmetic processor, and adding the arithmetically-processed data to the output data of the arithmetic data portion to output the second internal data;
      an error compensator for compensating for a round-off error for the second internal data which is the output data of the arithmetic processor; and
      a third data register for storing the output data of the error compensator.

8. The digital base booster as claimed in claim 7, wherein the arithmetic data portion comprises:
   a second multiplexer for selecting the second internal data and the output data of the data assigner;
   a fourth data register for storing the output data of the second multiplexer; and
   a data path controller for controlling transmission of the output data of the fourth data register.

9. The digital base booster as claimed in claim 7, wherein the arithmetic processor comprises:
   a barrel shifter for performing an arithmetic operation in response to the output data of the first multiplexer;
   a first adder for adding the output data of the barrel shifter; and
   a second adder for adding the output data of the first adder to the output data of the arithmetic data portion.

* * * * *